United States Patent [19]

Millman

[11] Patent Number: 5,107,148

[45] Date of Patent: Apr. 21, 1992

[54] BIDIRECTIONAL BUFFER HAVING TRI-STATE BUFFERS FOR CIRCUIT ISOLATION

[75] Inventor: Steven D. Millman, Mesa, Ariz.

[73] Assignee: Motorola, Inc., Schaumburg, Ill.

[21] Appl. No.: 684,634

[22] Filed: Apr. 12, 1991

[51] Int. Cl.$^5$ .............. G06F 11/20; G05B 24/02; H03K 19/094; H03K 17/04

[52] U.S. Cl. .................. 307/473; 307/475; 307/242; 307/468

[58] Field of Search ............... 307/473, 475, 450–453, 307/448, 243, 571, 572, 577, 581, 584, 585, 270, 273, 242

[56] References Cited

U.S. PATENT DOCUMENTS

| | | | |
|---|---|---|---|
| 4,154,978 | 5/1979 | Tu | 307/242 X |
| 4,419,592 | 12/1983 | Norgren et al. | 307/242 X |
| 4,479,067 | 10/1984 | Fujita | 307/448 X |
| 4,756,006 | 7/1988 | Rickard | 307/473 X |
| 4,827,368 | 5/1989 | Suzuki et al. | 307/482.1 X |
| 4,866,309 | 9/1989 | Bonke et al. | 307/242 X |
| 5,023,487 | 6/1991 | Wellheuser et al. | 307/473 X |

*Primary Examiner*—Edward P. Westin
*Assistant Examiner*—David R. Bertelson
*Attorney, Agent, or Firm*—Bradley J. Botsch

[57] ABSTRACT

When testing one circuit block of a device, it is desired to have isolation from the other circuit blocks of the device so as to prevent possible failure of the other circuit blocks. A block isolation buffer includes a circuit for providing predetermined voltage levels at the inputs of the circuit blocks which are not being tested thereby assuring that an undesired input does not appear at the inputs of the non-tested circuit blocks.

4 Claims, 1 Drawing Sheet

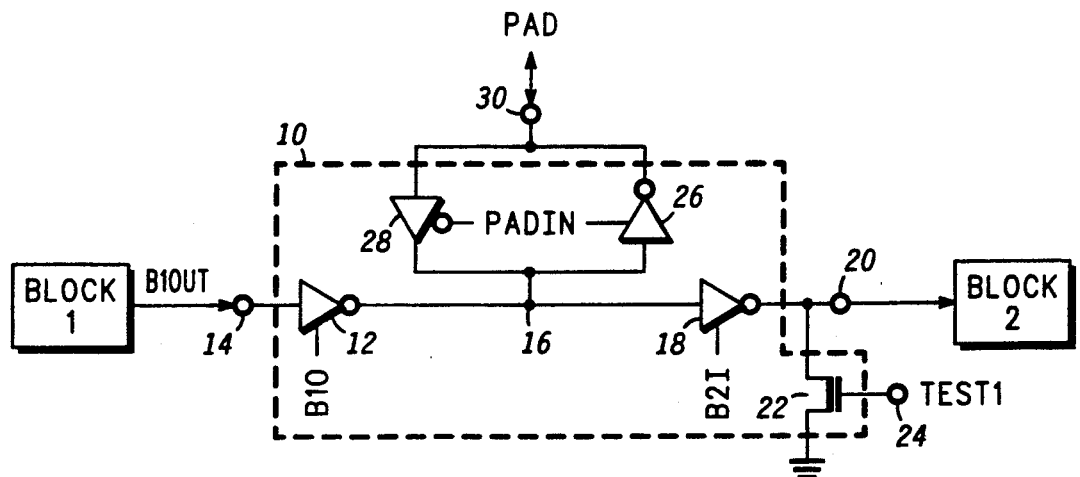
FIG. 1
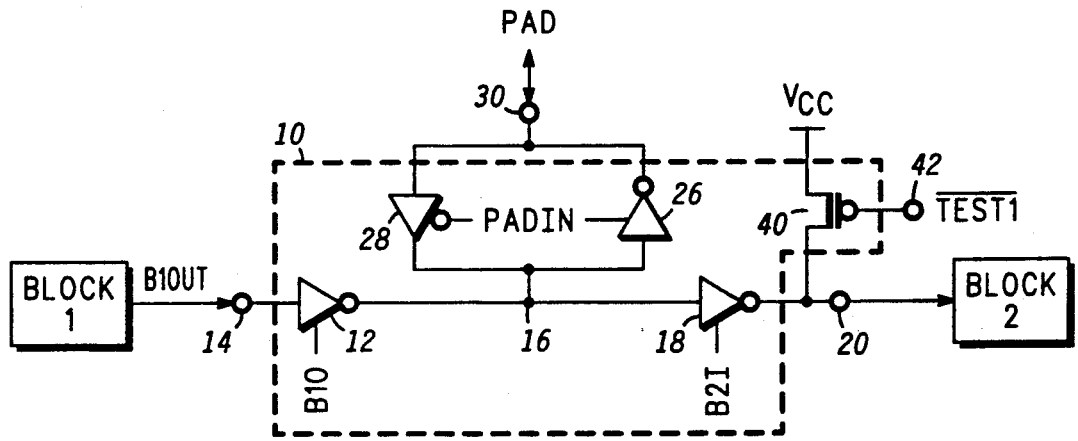
FIG. 2
FIG. 3
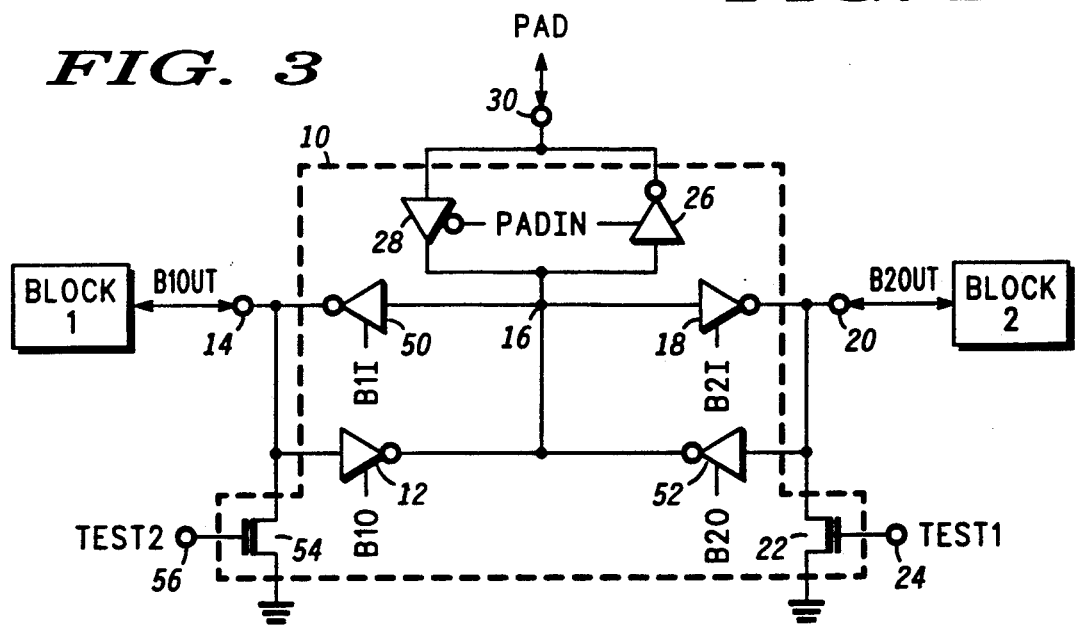

BIDIRECTIONAL BUFFER HAVING TRI-STATE BUFFERS FOR CIRCUIT ISOLATION

BACKGROUND OF THE INVENTION

This invention relates to buffers, such as buffers for providing isolation.

A circuit design typically includes a plurality of circuit blocks. The testing of the circuit design for functionality can be accomplished by independently testing each circuit block by providing known logic patterns to the inputs of a circuit block and then observing the respective outputs of the circuit block as is understood. However, when more than one circuit block is being tested, a logic pattern used to test a first circuit block may not be an acceptable logic pattern to a second circuit block wherein a valid logic pattern to the first circuit block may cause a failure in the second circuit block. Further, as circuits grow in size and complexity, the logic patterns that adequately test a given circuit block typically become increasingly difficult to generate. Therefore, after generating a test pattern for one circuit block, it would be a substantial hindrance to realize that the test pattern could not be used since it would cause a failure in another circuit block. Thus, when testing one circuit block on a design, it would be advantageous to isolate all other circuit blocks on the design so as to prevent catastrophic failures of the other circuit blocks.

Hence, when testing one circuit block of a circuit design, there exists a need to provide isolation for the other circuit blocks of the circuit design.

SUMMARY OF THE INVENTION

Briefly, there is provided a buffer circuit comprising a plurality of tri-state inverters respectively coupled between a plurality of terminals and a circuit node for providing isolation between the plurality of terminals; and a circuit responsive to a control signal and coupled to at least one of the plurality of terminals for providing a predetermined voltage thereat.

It is an advantage of the present invention to provide a block isolation buffer for isolating one circuit block of an integrated circuit or a circuit board from other circuit blocks within the integrated circuit or the circuit board.

It is also an advantage of the present invention that when testing a first circuit block, the inputs of other circuit blocks which are affected by the testing of the first circuit block are forced to known logic states.

BRIEF DESCRIPTION OF THE DRAWING

FIG. 1 is a partial schematic/block diagram illustrating a first embodiment of a block isolation buffer in accordance with the present invention;

FIG. 2 is a partial schematic/block diagram illustrating a second embodiment of a block isolation buffer in accordance with the present invention; and FIG. 3 is a partial schematic/block diagram illustrating a third embodiment of a block isolation buffer in accordance with the present invention.

DETAILED DESCRIPTION OF THE INVENTION

Referring to FIG. 1, a partial schematic/block diagram illustrating a first embodiment of block isolation buffer 10 is shown comprising tri-state inverter 12 having an input coupled to terminal 14 and an output coupled to circuit node 16. Tri-state inverter 18 has an input coupled to circuit node 16 and an output coupled to terminal 20. The output of tri-state inverter 18 is also coupled to the drain electrode of N-channel MOS transistor 22. The gate electrode of transistor 22 is coupled to terminal 24 at which signal TEST1 is applied, while the source electrode of transistor 22 is returned to ground. Circuit node 16 is coupled to the input of tri-state inverter 26 and to the output of tri-state inverter 28. The output of tri-state inverter 26 and the input of tri-state inverter 28 are both coupled to terminal 30. The control inputs of tri-state inverters 12, 18 and 26 are respectively coupled to receive signals B1O, B2I and PADIN wherein tri-state inverters 12, 18 and 26 are placed in a tri-state condition when a logic high signal is applied to its respective control input and function as inverters when a logic low level is applied to its respective control inputs. Tri-state inverter 28 has a control input coupled to receive signal PADIN wherein tri-state inverter 28 is placed in a tri-state condition when a logic low signal is applied to its control input and functions as an inverter when a logic high level is applied to its control input. Terminal 30 is coupled to a pad of the chip for passing bi-directional data (PAD).

Under normal operation (when BLOCK1 is not being tested), block isolation buffer 10 can be configured to output data from BLOCK1 to terminals 20 and 30. This is referred to as normal mode with BLOCK1 being used to output data (mode NB1O). In mode NB1O, signals B1O, B2I, PADIN and TEST1 are all a logic low and transistor 22 is rendered non-operative. As a result, data at the output of BLOCK1 (B1 out) appears at terminals 20 and 30 via inverters 12 and 18, and inverters 12 and 26, respectively.

In addition, under normal operation, block isolation buffer 10 can be configured to input data from terminal 30 via signal PAD to BLOCK2. This is referred to as normal mode with signal PAD being used to input data (mode NPI). In mode NPI, signal B1O is a logic high to prevent contention at circuit node 16 due to BLOCK1. Signal PADIN is a logic high and, thus, tri-state inverter 26 is placed in a tri-state condition while tri-state inverter 28 functions as an inverter. Further, signals B2I and TEST1 are at logic lows to allow signal PAD to flow through inverters 28 and 18 and appear at terminal 20. It is understood that one does not care what signal is present at the output of BLOCK1 since tri-state inverter 12 is in the tri-state mode.

When testing BLOCK1, block isolation buffer 10 can be configured to test the output of BLOCK1. This is referred to as mode TB1O. In mode TB1O, block isolation buffer 10 isolates the input pad of BLOCK2 from the output of BLOCK1. Thus, when the output of BLOCK1 is being tested, signals B1O and PADIN are at logic lows and data appearing at the output of BLOCK1 flows through inverters 12 and 26 and subsequently appears at terminal 30 for providing signal PAD. However, tri-state inverter 18 is placed in a tri-state condition by signal B2I being in a logic high state. Further, signal TEST1 is also a logic high which renders transistor 22 operative thereby functioning to pull the input of BLOCK2 to a known logic level, that is, a logic low voltage level (L). This is known as a logic low option since the input of BLOCK2 was pulled to a logic low voltage level by transistor 22. Thus, block isolation buffer 10 isolates BLOCK2 from BLOCK1 via tri-state inverter 18 and further provides a predetermined voltage level at the input of BLOCK2 via transistor 22. This ensures that while BLOCK1 is being tested, the input of BLOCK2 is maintained at a known logic state thereby preventing undesired signals from occurring at BLOCK2.

Block isolation buffer 10 can also be configured to test the input of BLOCK2. This is referred to as mode TB2I. In mode TB2I, signal B1O is a logic high to prevent data appearing at the output of BLOCK1 from reaching circuit node 16 and ultimately terminals 20 or 30. Signal PADIN is a logic high to allow data to be input to terminal 30. Also, signals B2I and TEST1 are at logic lows to allow data which appears at terminal 30 to flow through inverters 28 and 18 and be input to BLOCK2.

The signal assignments for block isolation buffer 10 of FIG. 1 for both normal modes of operation (NB1O and NPI) and both test modes of operation (TB1O and TB2I) can be summed up in Table 1 where a dash (—) represents a "don't care".

TABLE 1.

| Signal Assignments For BLOCK1 Output and BLOCK2 Input With a Low Option. | | | | | | | |
|---|---|---|---|---|---|---|---|
| Mode | TEST1 | B1O | B2I | PADIN | PAD | BLOCK1 | BLOCK2 |
| NB1O | L | L | L | L | B1OUT | B1OUT | B1OUT |
| NPI | L | H | L | H | PAD | — | PAD |
| TB1O | H | L | H | L | B1OUT | B1OUT | L |
| TB2I | L | H | L | H | PAD | — | PAD |

From Table 1, one can deduce that the following dependencies exist:

1) Signal PADIN = signal B1O; and
2) Signal B2I = signal TEST1.

Thus, block isolation buffer 10 only requires two control signals (PADIN and B2I). Further, if BLOCK1 and BLOCK2 are coupled to a data bus, inverters 12, 18, 26 and 28 are typically already present. Therefore, block isolation buffer 10 requires only one additional transistor (22) and one additional signal (TEST1).

It is worth noting that the delay from any terminal (14, 20 and 30) to any other terminal is substantially equal to two tri-state inverter delays. For example, the delay from terminal 14 to terminal 20 is substantially equal to the delay through inverters 12 and 18 while the delay from terminal 14 to terminal 30 is substantially equal to the delay through inverters 12 and 26. Further, although only two circuit blocks are shown, it should be realized that block isolation buffer 10 can be expanded to accommodate any number of circuit blocks wherein each additional circuit block would have corresponding tri-state inverters associated therewith. In addition, if the additional circuit block has an input coupled to node 16, then a corresponding transistor (similar to transistor 22) would be coupled to the input of the additional circuit block.

Referring to FIG. 2, a partial schematic/block diagram illustrating a second embodiment of block isolation buffer 10 is shown. It is understood that components similar those shown in FIG. 1 are identified by like reference numerals. Block isolation buffer 10 of FIG. 2 includes P-channel MOS transistor 40 having a drain electrode coupled to terminal 20 and a gate electrode coupled to terminal 42 at which signal $\overline{\text{TEST1}}$ is applied. The source electrode of P-channel MOS transistor 40 is coupled to operating potential $V_{CC}$. The operation of the circuit of FIG. 2 is identical to the operation of the circuit in FIG. 1 with the exception that P-channel MOS transistor 40, when rendered operative, pulls the voltage appearing at terminal 20 to a logic high voltage level (H) whereas N-channel MOS transistor 22 of FIG. 2, when rendered operative, pulled the voltage appearing at terminal 20 to a logic low voltage level (L). Therefore, block isolation buffer 10 of FIG. 2 includes a logic high option since the input of BLOCK2 is pulled to a logic high voltage level by transistor 40.

Similar to Table 1, the signal assignments for block isolation buffer 10 of FIG. 2 for both normal modes of operation (NB1O and NPI) and both test modes of operation (TB1O and TB2I) can be summed up in Table 2.

TABLE 2

| Signal Assignments For BLOCK1 Output and BLOCK2 Input With a High Option. | | | | | | | |
|---|---|---|---|---|---|---|---|
| Mode | $\overline{\text{TEST1}}$ | B1O | B2I | PADIN | PAD | BLOCK1 | BLOCK2 |
| NB1O | H | L | L | L | B1OUT | B1OUT | B1OUT |
| NPI | H | H | L | H | PAD | — | PAD |
| TB1O | L | L | H | L | B1OUT | B1OUT | L |
| TB2I | H | H | L | H | PAD | — | PAD |

From Table 2, one can deduce that the following dependencies exist:

1) Signal PADIN = signal B1O; and
2) Signal B2I = signal TEST1.

Similar to the circuit of FIG. 1, block isolation buffer 10 of FIG. 2 only requires two control signals (PADIN and B2I). Further, if BLOCK1 and BLOCK2 are coupled to a data bus, inverters 12, 18, 26 and 28 are typically already present. Therefore, block isolation buffer 10 requires only one additional transistor (40) and one additional signal ($\overline{\text{TEST1}}$).

In summary, the input of BLOCK2 is isolated from the output of BLOCK1 when BLOCK1 is being tested. Further, the input of BLOCK2 is pulled to a known logic level wherein the circuit of FIG. 1 pulls the input of BLOCK2 to a logic low voltage level (low option) while the circuit of FIG. 2 pulls the input of BLOCK2 to a logic high voltage level (high option).

Referring to FIG. 3, a detailed schematic/block diagram of a third embodiment of block isolation buffer 10 is shown. It is understood that components some similar to those of FIG. 1 are identified by like reference numerals. Block isolation buffer 10 of FIG. 3 includes tri-state inverter 50 having an input coupled to circuit node 16 and an output coupled to terminal 14. Tri-state inverter 52 has an input coupled to terminal 20 and an output coupled to circuit node 16. The control input for tri-state inverter 50 is coupled to receive signal B1I while the control input for tri-state inverter 52 is coupled to receive signal B2O. N-channel MOS transistor 54 has a drain electrode coupled to terminal 14 and a gate electrode coupled to terminal 56 at which signal TEST2 is applied. The source electrode of N-channel MOS transistor 54 is returned to ground.

Under normal operation, block isolation buffer 10 of FIG. 3 can be configured in one of three modes:
1) Normal mode, BLOCK1 being used to output data, NB1O;
2) Normal mode, BLOCK2 being used to output data, NB2O; and
3) Normal mode, terminal 30 receiving input data via signal PAD, NPI.

In mode NB1O, signals TEST1, TEST2, B1O, B2I and PADIN are at logic low voltage levels and transistors 22 and 54 are rendered non-operative. This allows data appearing at terminal 14 (B1OUT) via BLOCK1 to appear at terminals 20 and 30. Further, signals B1I and B2O are at logic high voltage levels thereby respectively placing tri-state inverters 50 and 52 in a tri-state mode. This prevents data from being input to BLOCK1 and output from BLOCK2.

In mode NB2O, operation is identical to mode NB1O operation with the exception that BLOCK2 is now being used to output data. Thus, signals B1I, B1O, B2I and B2O are complementary logic values with respect to mode NB1O and data appearing at terminal 20 (B2OUT) via BLOCK2 also appears at terminals 14 and 30.

In mode NPI, signals TEST1, TEST2, B1I and B2I are all logic low voltage levels while signal PADIN is a logic high voltage level. This allows data to be input from terminal 30 via signal PAD to BLOCK1 and BLOCK2. Further, signals B1O and B2O are at logic high voltage levels and tri-state inverters 12 and 52 are respectively placed in the tri-state mode. This prevents data from being output from BLOCK1 or BLOCK2.

During testing, block isolation buffer 10 of FIG. 3 can be configured in one of four modes:
1) Test mode, testing the output of BLOCK1, TB1O;
2) Test mode, testing the input of BLOCK1, TB1I;
3) Test mode, testing the output of BLOCK2, TB2O; and
4) Test mode, testing the input of BLOCK2, TB2I.

In mode TB1O, block isolation buffer 10 of FIG. 3 isolates the input of BLOCK2 from the output of BLOCK1. Thus, when the output of BLOCK1 is being tested, signals B1O and PADIN are at logic lows and data appearing at the output of BLOCK1 flows through inverters 12 and 26 and subsequently appears at terminal 30 for providing signal PAD. However, tri-state inverters 18, 50 and 52 are placed in a tri-state condition by signals B2I, B1I and B2O being in a logic high state, respectively. Further, signal TEST1 is also a logic high which renders transistor 22 operative thereby functioning to pull the input of BLOCK2 to a logic low voltage level (L). Signal TEST2 is a logic low and, thus, transistor 54 is rendered non-operative.

In mode TB1I, signal B1O is a logic high voltage level to prevent data which appears at the output of BLOCK1 to reach circuit node 16 and ultimately terminals 20 or 30. Also, signals B2I, B2O and TEST1 are at logic high voltage levels so that data is neither input to nor output from BLOCK2, while terminal 20 is maintained at a logic low voltage level. Signal PADIN is a logic high to allow data to be input to terminal 30. Also, signal B1I is at logic low voltage level to allow data which appears at terminal 30 to flow through inverters 28 and 50 and be input to BLOCK1.

The operation of the circuit in FIG. 3 for modes TB2O and TB2I is similar to the operation of modes TB1O and TB1I, respectively, with the exception that BLOCK2 is being tested and BLOCK1 is being isolated and maintained at a predetermined logic voltage level. Further, similar to Tables 1 and 2, the signal assignments for block isolation buffer 10 of FIG. 3 for the normal modes of operation (NB1O, NB2O and NPI) and the test modes of operation (TB1O, TB1I, TB2O and TB2I) can be summed up in Table 3.

TABLE 3.

| | Signal Assignments For BLOCK1 Bi-Directional and BLOCK2 Bi-Directional With a Low Option. | | | | | | | | |
|---|---|---|---|---|---|---|---|---|---|
| Mode | TEST1 | TEST2 | B1I | B1O | B2I | B2O | PADIN | PAD | BLOCK1 | BLOCK2 |
| NB1O | L | L | H | L | L | H | L | B1OUT | B1OUT | B1OUT |
| NB2O | L | L | L | H | H | L | L | B2OUT | B2OUT | B2OUT |
| NPI | L | L | L | H | L | H | H | PAD | PAD | PAD |
| TB1O | H | L | H | L | H | H | L | B1OUT | B1OUT | L |
| TB1I | H | L | L | H | H | H | H | PAD | PAD | L |
| TB2O | L | H | H | H | H | L | L | B2OUT | L | B2OUT |
| TB2I | L | H | H | H | L | H | H | PAD | L | PAD |

From Table 3, one can deduce that the following signal dependencies exist:
1) PADIN = (B1O) AND (B2O);
2) B1I = B1O + TEST2
3) B2I = B2O + TEST1;
4) B1O = B1I + TEST2; and
5) B2O = B2I + TEST1.

Thus, block isolation buffer 10 of FIG. 3 requires only four separate control signals, TEST1, TEST2, B2I and B1I wherein the rest can be derived from the four aforementioned signals. Further, if BLOCK1 and BLOCK2 are coupled to a bi-directional data bus, inverters 12, 18, 50 and 52 are already present along with signals B1O, B2I, B1I and B2O, respectively. Therefore, block isolation buffer 10 of FIG. 3 only requires two additional transistors (22 and 54) and two additional control signals (TEST1 and TEST2).

It is worth noting that the delay from any terminal (14, 20 and 30) to any other terminal is substantially equal to two tri-state inverter delays as aforedescribed for the circuit of FIG. 1. Further, although only two circuit blocks are shown, it should be realized that block isolation buffer 10 of FIG. 3 can be expanded to accommodate any number of circuit blocks wherein each additional circuit block would have corresponding tri-state inverters and pull down transistors associated therewith. In addition, N-channel MOS transistors 22 or 54 or both could be P-channel MOS transistors such that BLOCK1 or BLOCK2 or both would be pulled to a logic high voltage level when transistors 54 and 22 are respectively rendered operative.

Further, the present invention has been illustrated with only two circuit blocks (BLOCK1, BLOCK2), but it should be understood that any number of circuit blocks could be coupled to circuit node 16. However, when more than two circuit blocks are coupled to circuit node 16, the test signals, which render operative transistor 22, transistor 54, and the corresponding transistors for the other circuit blocks, become more complex, for example, an ORed function of a plurality of signals.

By now it should be apparent from the foregoing discussion that a novel block isolation buffer circuit has been provided for isolating one circuit block with respect to other circuit blocks on a chip. Further, the inputs of the isolated circuit blocks are maintained at predetermined logic levels.

I claim:

1. A buffer circuit for providing isolation between circuit blocks within an integrated chip, comprising:
   a first tri-state inverter having an input and an output, said input of said first tri-state inverter being coupled to a first circuit block, said output of said first tri-state inverter being coupled to a circuit node;
   a second tri-state inverter having an input and an output, said input of said second tri-state inverter being coupled to said circuit node, said output of said second tri-state inverter being coupled to a second circuit block;
   a third tri-state inverter having an input and an output, said input of said third tri-state inverter being coupled to said circuit node, said output of said third tri-state inverter being coupled to a bi-directional terminal;
   a fourth tri-state inverter having an input and an output, said input of said fourth tri-state inverter being coupled to said bi-directional terminal, and said output of said fourth tri-state inverter being coupled to said circuit node; and
   means coupled to at least one of said circuit blocks for providing a predetermined voltage thereat.

2. The buffer circuit according to claim 1 wherein said means includes a transistor having first, second and control electrodes, said first electrode being coupled to said first circuit block, said control electrode being coupled to receive a test signal, and said second electrode being coupled to a first supply voltage terminal.

3. A buffer circuit for providing isolation between circuit blocks within an integrated chip, comprising:
   a first pair of tri-state inverters coupled between a first circuit block and a circuit node;
   a second pair of tri-state inverters coupled between a second circuit block and said circuit node;
   a third pair of tri-state inverters coupled between said circuit node and a bi-directional terminal; and
   means coupled to at least one circuit block for providing a predetermined voltage thereat.

4. The buffer circuit according to claim 3 wherein said means includes a transistor having first, second and control electrodes, said first electrode being coupled to said first circuit block, said control electrode being coupled to receive a test signal, and said second electrode being coupled to a first supply voltage terminal.

* * * * *